United States Patent [19]

Ninomiya

[11] Patent Number: 5,333,122

[45] Date of Patent: Jul. 26, 1994

[54] ELECTRICALLY ERASABLE AND PROGRAMMABLE NON-VOLATILE SEMICONDUCTOR MEMORY DEVICE HAVING WORD LINE VOLTAGE CONTROL CIRCUIT USING INTERNAL VOLTAGE BOOSTER CIRCUIT

[75] Inventor: Kazuhisa Ninomiya, Tokyo, Japan

[73] Assignee: NEC Corporation, Japan

[21] Appl. No.: 978,986

[22] Filed: Nov. 19, 1992

[30] Foreign Application Priority Data

Nov. 29, 1991 [JP] Japan ................. 3-317110

[51] Int. Cl.⁵ .............................. G11C 7/00
[52] U.S. Cl. .................. 365/189.11; 365/189.06; 365/185
[58] Field of Search ............. 365/185, 189.01, 230.06, 365/189.11, 189.09, 189.06

[56] References Cited

U.S. PATENT DOCUMENTS

| | | | |
|---|---|---|---|
| 4,737,936 | 4/1988 | Takeuchi | 365/189.09 |
| 4,893,275 | 1/1990 | Tanaka et al. | 365/189.09 |
| 4,967,399 | 10/1990 | Kuwabara et al. | 365/189.11 |
| 5,058,063 | 10/1991 | Wada et al. | 365/189.11 |
| 5,140,557 | 8/1992 | Yoshida | 365/189.09 |

Primary Examiner—Eugene R. LaRoche
Assistant Examiner—Vu A. Le
Attorney, Agent, or Firm—Laff, Whitesel, Conte & Saret

[57] ABSTRACT

A flash memory is operable using a single power supply voltage. In this flash memory, an internal booster circuit boosts the supply voltage to generate a write voltage higher than the supply voltage. A row decoder is connected to word lines, which are connected to memory cells. Upon reception of an address signal, the row decoder selects a word line specified by this address signal. A row-line clamp circuit, which is connected to the internal booster circuit and the word lines, supplies the write voltage to a word line selected at the time of data writing, and drops the write voltage and supplies it to the selected word line at the time of write verify.

4 Claims, 4 Drawing Sheets

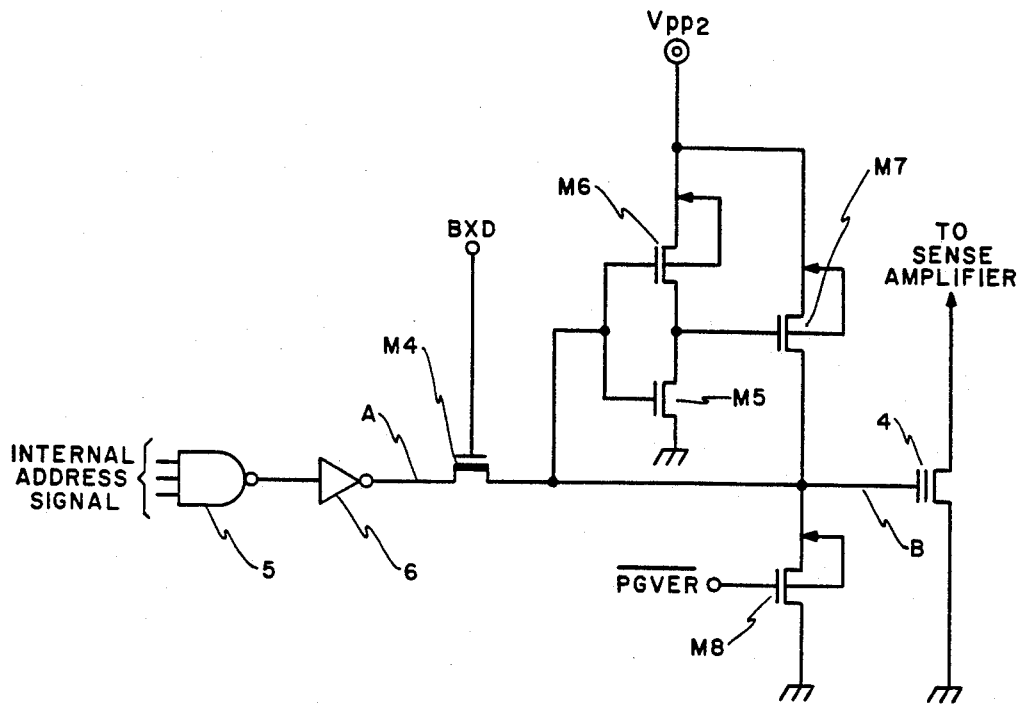
FIG. 4
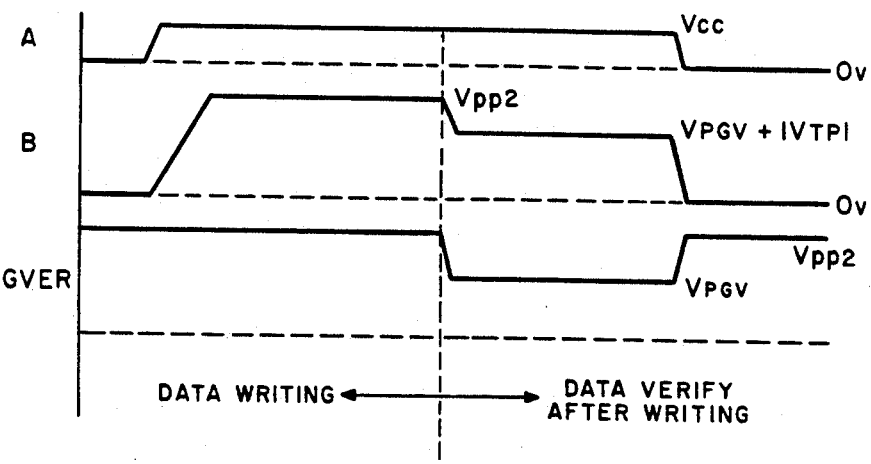

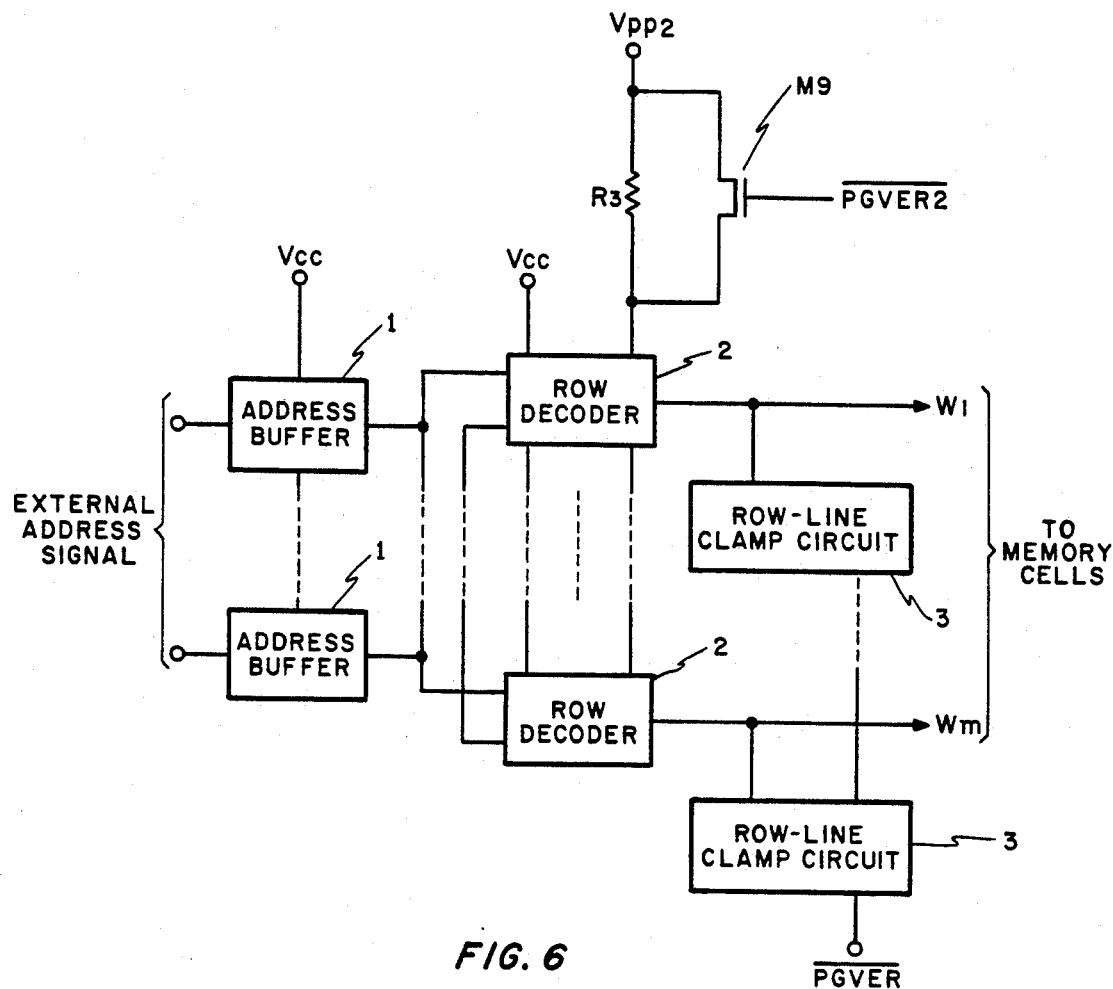
FIG. 6
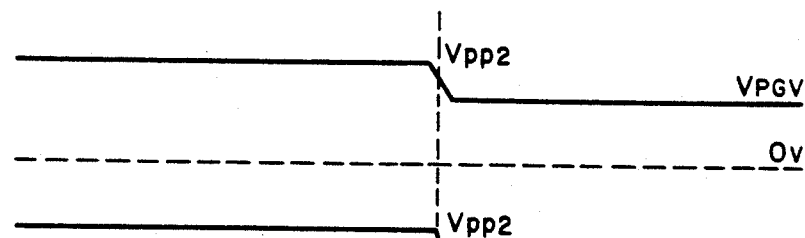
FIG. 7A  Wi
FIG. 7B  PGVER2
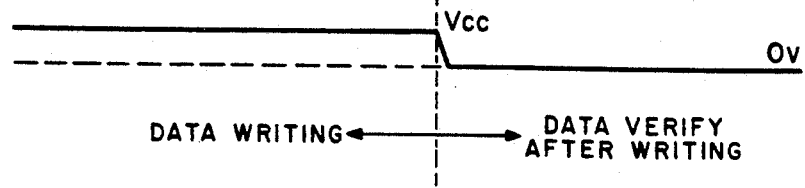
FIG. 7C  PGVER

ELECTRICALLY ERASABLE AND PROGRAMMABLE NON-VOLATILE SEMICONDUCTOR MEMORY DEVICE HAVING WORD LINE VOLTAGE CONTROL CIRCUIT USING INTERNAL VOLTAGE BOOSTER CIRCUIT

BACKGROUND OF THE INVENTION

1. Field of the Invention

The present invention relates to an electrically writable and erasable non-volatile semiconductor memory device (flash memory) operable on power from a single power supply.

2. Description of the Related Art

There is an electrically writable and erasable non-volatile semiconductor memory device (hereinafter called "flash memory").

FIG. 1 shows an example of the structure of this flash memory. In FIG. 1 an address signal is supplied via address buffers 1 to row decoders 2.

A voltage switching circuit 11 is supplied with a power supply voltage Vcc, a first high voltage Vpp for data writing and control signals PG and PGVER and outputs a voltage Vpp2. At the time of writing data in memory cells 4, the voltage switching circuit 11 outputs a first high voltage (e.g., 12 V) higher than the power supply voltage Vcc as the voltage Vpp2. At the time of write verifying, the voltage switching circuit 11 outputs a second high voltage lower than the first high voltage Vpp but higher than the supply voltage Vcc as the voltage Vpp2. The write verify is a process to check whether or not the threshold voltage of a data-written memory cell transistor has risen to a sufficient level.

Each row decoder 2 decodes the received address signal, and selects a word line connected to the gates of those memory cells 4 in the selected row to apply the voltage from the voltage switching circuit 11 to the word line. That is, in writing data, each row decoder 2 applies the first high voltage Vpp to the Gate of the selected memory cell 4. The threshold voltage of the memory cell transistor 4 where data has been written rises higher than those of unwritten memory cell transistors 4, and this memory cell transistor 4 becomes non-conductive at the time of normal data reading. When write verify is to be executed, the row decoder 2 applies the second high voltage to the gate of the selected memory cell transistor 4 to read data therefrom, and checks if this memory cell transistor 4 is non-conductive.

FIG. 2 illustrates the arrangement of the essential portions of the voltage switching circuit 11. With the illustrated structure, at the time of normal data reading, a control circuit (not shown) sets PG=0 V, PGVER=0 V and $\overline{PG+PGVER}$=Vcc. This renders N type MOS transistors M1 and M2 non-conductive and an N type depletion transistor M3 conductive, so that read voltage (power supply voltage) Vcc is output as an output voltage Vpp2.

At the time of data writing, the control circuit sets PG=Vpp, PGVER=0 V and $\overline{PG+PGVER}$=0 V. Consequently, the N type MOS transistor M1 becomes conductive, causing the first high voltage Vpp to be output as the output voltage Vpp2.

At the time of write verify, the control circuit sets PG and $\overline{PG+PGVER}$ to 0 V, and PGVER to Vpp. As a result, the N type MOS transistor M2 becomes conductive, causing the second high voltage (R2/(R1+R2))Vpp to be output as the output voltage Vpp2. The proper gate voltage of a target memory cell transistor at the write verify time can be set by properly determining the resistances R1 and R2.

If a flash memory is of a type that is externally supplied with only the supply voltage Vcc, the mentioned voltage Vpp should be produced from the supply voltage Vcc within the chip using a booster circuit. Generally, such a booster circuit has a small current drive capacity, which lowers the speed of switching the gate of each memory cell transistor 4 and thus slowing the operation speed of the whole memory device.

SUMMARY OF THE INVENTION

It is therefore an object of the present invention to provide a flash memory operable with a single power supply voltage and capable of switching the gates of memory cell transistors at high speed.

To achieve this object, a flash memory according to the present invention comprises:

memory cells for storing data;

an internal booster circuit for generating a first voltage for data writing, higher than a supply voltage upon reception thereof; and supply means, connected to the memory cells and the internal booster circuit, for receiving an address signal, supplying the first voltage to a gate of that memory cell which is specified by the address signal at a time of data writing, and dropping the first voltage to a second voltage lower than the first voltage but higher than the supply voltage and supplying the second voltage to the gate of the memory cell at a write verifying time.

With the above structure, the first voltage acquired by boosting the supply voltage is supplied to the gate of that memory cell which is specified by an address signal at the time of data writing, and the second voltage acquiring by dropping the first voltage is supplied to the gate of the memory cell at the write verifying time. In other words, the gate voltage of the memory cell at the write verify time is acquired by dropping the voltage that is applied to this gate at the data writing time. This design can make the speed of switching the gate of a target memory cell transistor faster than the scheme that uses a booster circuit to control the gate voltage.

BRIEF DESCRIPTION OF THE DRAWINGS

FIG. 4 is a circuit diagram illustrating a row decoder and a row-line clamp circuit, shown in FIG. 3;

FIGS. 5A through 5C are timing charts illustrating the operation of the circuits shown in FIGS. 3 and 4;

FIG. 6 is a block diagram illustrating the structure of a semiconductor memory device according to a second embodiment of the present invention; and FIGS. 7A through 7C are timing charts illustrating the operation of the circuit shown in FIG. 6.

DETAILED DESCRIPTION OF THE PREFERRED EMBODIMENTS

Preferred embodiments of the present invention will now be described referring to the accompanying drawings.

Figure 1:
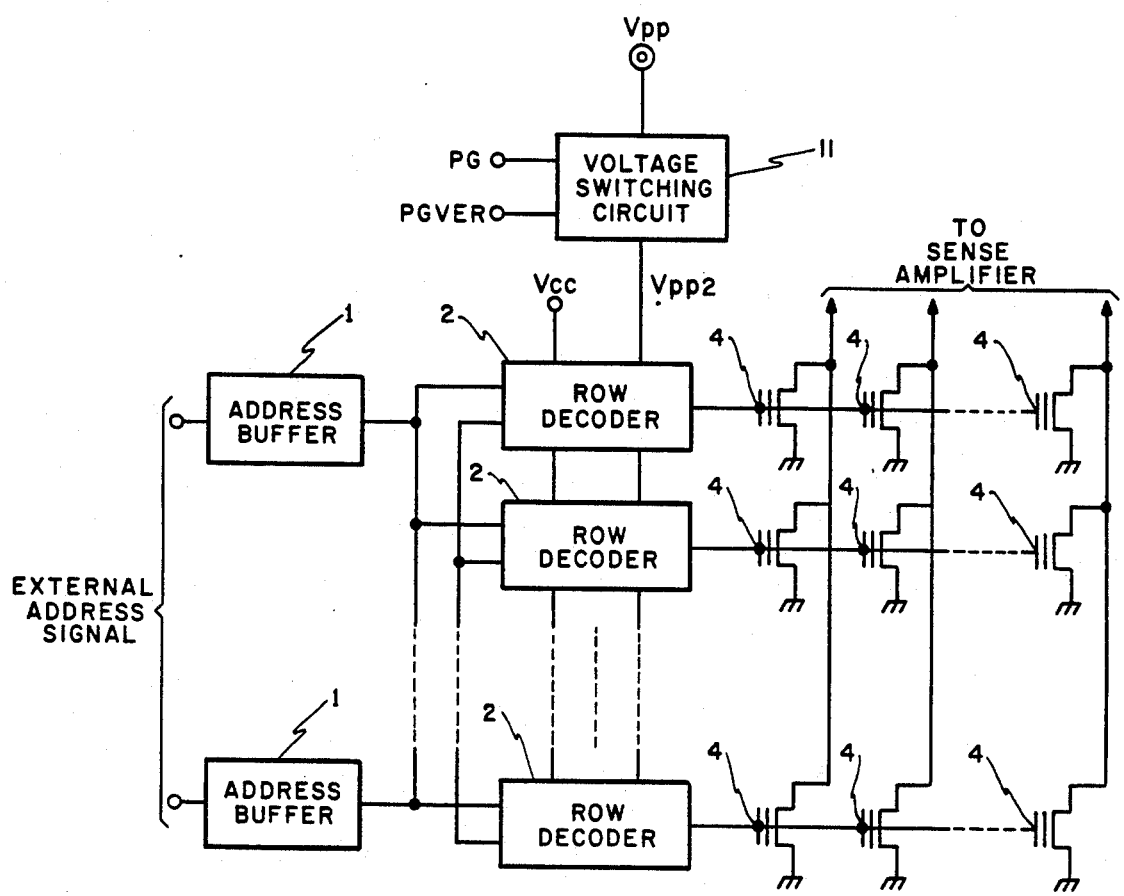
FIG. 1 is a block diagram illustrating the structure of a conventional semiconductor memory device.
Figure 2:
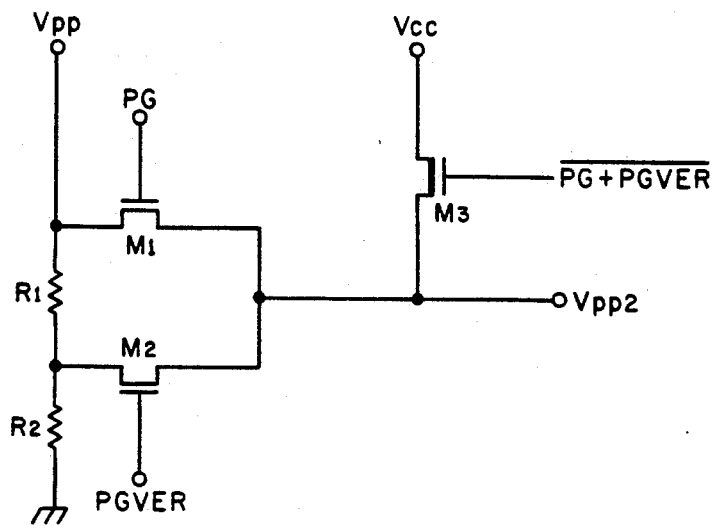
FIG. 2 is a circuit diagram of a voltage switching circuit shown in FIG. 1.
Figure 3:
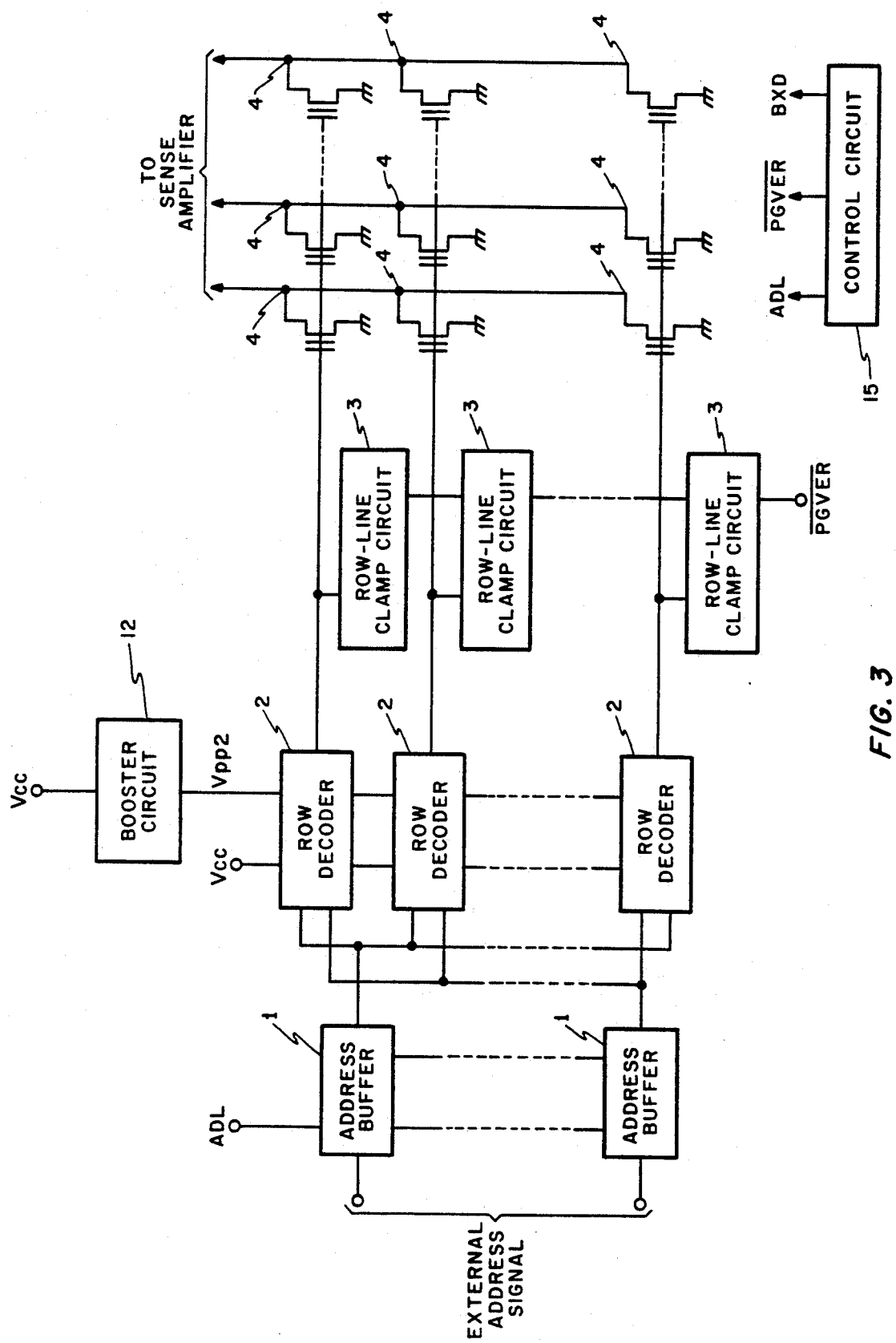
FIG. 3 is a block diagram illustrating the structure of a semiconductor memory device according to a first embodiment of the present invention.

FIG. 3 presents a circuit block diagram illustrating the structure of an electrically writable and erasable non-volatile semiconductor memory device (flash memory) according to a first embodiment of the present invention.

Address buffers 1 receive an n-bit external address signal and outputs an internal address signal. The address buffers 1 latch the internal address signal in response to an address latch signal ADL at the times of data writing and write verify, and holds it during the data writing period and write verify period.

A booster circuit 12 receives a power supply voltage Vcc and supplies an internally boosted voltage Vpp2 to individual row decoders 2.

Each row decoder 2 is supplied with the internal address signal. In accordance with the internal address signal, each row decoder 2 supplies the power supply voltage Vcc via an associated word line to the gates of associated memory cell transistors 4 at the time of data reading, and supplies the boosted voltage Vpp2 from the booster circuit 12 to those gates at the time of data writing. At the time of write verify, the row decoder 2 supplies a voltage acquired by dropping the boosted voltage Vpp2 to the gate of the target memory cell transistor 4 in accordance with the internal address signal in cooperation with an associated row-line clamp circuit 3 (to be described later).

Each row-line clamp circuit 3 is supplied with a row-line clamp control signal $\overline{PGVER}$. In accordance with the control signal $\overline{PGVER}$, the row-line clamp circuit 3 pulls down the voltage Vpp2, supplied to the gate of the memory cell transistor 4, to $V_{PGV}+|V_{TP}|$ ($V_{PGV}$: verify reference voltage; $V_{TP}$: threshold voltage of a P type MOS transistor) at the write verify time.

A control circuit 15 produces a control signal BXD (to be described later) as well as the aforementioned address latch signal ADL and row-line clamp control signal $\overline{PGVER}$.

FIG. 4 illustrates the essential portions of each row decoder 2 and row-line clamp circuit 3 according to this embodiment.

Referring to FIG. 4, the internal address signal given from the address buffer 1 is supplied to a NAND gate 5. The NAND gate 5 outputs a low-level signal when the internal address signal satisfies a predetermined relationship. The output of the NAND gate 5 is connected via an invertor 6 to one end of a current path of an N type depletion transistor M4. The gate of the N type depletion transistor M4 is supplied with the control signal BXD, while the other end of the current path is connected to the gates of the associated memory cell transistors 4 through a word line.

This word line is connected to the gates of an N type MOS transistor M5 and a P type MOS transistor M6. One end of the current path of the N type MOS transistor M5 is grounded while the other end is connected to one end of the current path of the P type MOS transistor M6. The other end of the current path of the MOS transistor M6 is supplied with the internally boosted voltage Vpp2 from the booster circuit 12.

The word line is further connected to P type MOS transistors M7 and M8. The boosted voltage Vpp2 is applied to one end of the P type MOS transistor M7, which has its gate connected to a connection node between the transistors M5 and M6. The other end of the current path of the transistor M7 is connected to the word line.

One end of the current path of the P type MOS transistor M8 is grounded, while the other end is connected to the word line. The transistor M8 has its gate applied with the control signal $\overline{PGVER}$.

In FIG. 4, the NAND gate 5, the invertor 6 and the transistors M4–M7 constitute the row decoder 2. And, the transistor M8 constitutes the row-line clamp circuit 3.

In FIG. 4, the control signal BXD is set to 0 V at the times of data writing and write verify or to Vcc at other operational times.

The operation of the flash memory shown in FIGS. 3 and 4 will now be described referring to FIGS. 5A through 5C.

At the beginning of data writing, the control circuit 15 outputs the address latch signal ADL. In response to the address latch signal ADL, the address buffer 1 holds the internal address signal during the data writing period and the write verify period.

At the data writing time, the potential of a node A (output of the invertor 6) of the row selected by the internal address signal becomes Vcc, as shown in FIG. 5A. As the control signal BXD is 0 V, the N type depletion transistor M4 becomes a resistance, gradually raising the voltage on the word line. Consequently, the MOS transistors M5 and M6 start functioning to supply a low-level voltage to the gate of the MOS transistor M7, rendering the transistor M7 conductive. Meanwhile, as shown in FIG. 5C, the control circuit 15 outputs the boosted voltage Vpp2 supplied from the booster circuit as the signal $\overline{PGVER}$. This renders the P type MOS transistor M8 non-conductive.

The word line is charged (pulled up) by the P type MOS transistor M7, so that the voltage on the word line rises to the boosted voltage Vpp2 as shown in FIG. 5B. This voltage is applied to the gate of the memory cell transistor 4.

When the writing is complete and the write verify operation starts, the control circuit 15 sets the voltage level of the signal $\overline{PGVER}$ to the verify reference voltage $V_{PGV}$(Vcc<$V_{PGV}$<Vpp2), as shown in FIG. 5C. As a result, the P type MOS transistor M8 becomes conductive, discharging (pulling down) the charges on the word line. Since the current supply performance of the internal booster circuit 12 is smaller than the current drive performance of the P type MOS transistor M8, the gate voltage of the memory cell transistor 4 drops to $V_{PGV}+|V_{TP}|$ ($V_{TP}$: threshold voltage of the P type MOS transistor M8) from Vpp2, as shown in FIG. 5B.

In short, the boosted voltage Vpp2 is applied to the gate of the memory cell transistor 4 at the data writing time, and the voltage $V_{PGV}+|V_{TP}|$ acquired by dropping the boosted voltage Vpp2 is applied to this gate at the write verify time.

According to this embodiment, as described above, the gate voltage of the memory cell transistor 4 at the write verify time is acquired by dropping the gate voltage at the data writing time (the voltage on the word line). This scheme can thus make the action of switching the gate of the memory cell transistor 4 faster than the design which causes the booster circuit 12 to produce the voltage at the write verify time as separate from the data writing voltage and then supplies it to the memory cell transistor 4.

A second embodiment of this invention will be described below referring to FIGS. 6 and 7.

FIG. 6 presents a block diagram of a flash memory according to this embodiment. The fundamental structure of the flash memory shown in FIG. 6 is basically the same as that shown in FIG. 3. The difference however lies in that a parallel circuit of an N type depletion transistor M9 and a resistor R3 having a sufficiently large resistance (several mega-ohms) is inserted between the internally boosted voltage Vpp2 and the row decoders 2. Further, the control circuit supplies a control signal $\overline{\text{PGVER2}}$ to the gate of the transistor M9.

As shown in FIG. 7B, at the time data is written into this flash memory, the control circuit 15 sets $\overline{\text{PGVER2}}$=Vpp2 to render the N type depletion transistor M9 conductive, supplying the voltage Vpp2 to the row decoders 2. Further, the control circuit 15 sets the signal $\overline{\text{PGVER}}$ to the supply voltage Vcc as shown in FIG. 7C, rendering the N type depletion transistor M8 non-conductive. As a result, the voltage on the word line becomes Vpp2 as shown in FIG. 7A.

At the time of write verify, the control circuit 15 sets the signal $\overline{\text{PGVER2}}$ to 0 V to render the N type depletion transistor M9 non-conductive, supplying the voltage Vpp2 to the row decoders 2 via the resistor R3 with a high resistance. Further, the control circuit 15 sets the signal $\overline{\text{PGVER}}$ to 0 V to render the transistor M8 conductive. Accordingly, the voltage on the word line drops. Because the output current of the booster circuit 12 is restricted by the resistor R3, it is possible to prevent the boosted voltage Vpp2 from dropping more than necessary at the write verify time.

The present invention is not limited to the above-described embodiments, but it should be apparent to those skilled in the art that this may be embodied in many other specific forms without departing from the spirit or scope of the invention. For instance, although the control circuit 15 supplies the signal $\overline{\text{PGVER}}$ to each row decoder 2, the voltages Vpp2 and $V_{PGV}$ may be supplied to the row decoder 2 so that the row decoder 2 produces this signal itself.

What is claimed is:

1. A flash memory comprising:
   memory cells for storing data;
   an internal booster circuit for generating a first voltage for data writing, higher than a supply voltage upon reception thereof; and
   a voltage control circuit connected to said memory cells and said internal booster circuit, said voltage control circuit receiving an address signal,
   said voltage control circuit including first means for supplying the first voltage to a gate of a memory cell which is specified by the received address signal at a time of data writing, and
   second means for dropping the first voltage to a second voltage which is lower than the first voltage but higher than the supply voltage,
   said second means supplying the second voltage to the gate of said memory cell at a write verifying time, said second means comprising a transistor having a gate supplied with a control signal, a source connected to the gate of said memory cell and a drain connected to a ground terminal, said control signal having a first level that renders said transistor non-conductive at the time of data writing, and at the write verifying time said second level being lower than said second voltage by a threshold level of said transistor in order to cause said transmitter to drop the first voltage to the second voltage.

2. The flash memory according to claim 1, wherein said flash memory further comprises word lines connected to said memory cells;
   said first means supplying said first voltage to said word line which is specified by an address signal at said data writing time and said write verify time; and
   said second means dropping a voltage of said word line specified by the address signal at the write verify time.

3. A flash memory comprising:
   memory cells for storing data, word lines connected to said memory cells;
   an internal booster circuit for generating a first voltage upon reception data for writing, said first voltage being higher than a supply voltage;
   supply means, connected to said memory cells and said internal booster circuit, for receiving an address signal, for supplying the first voltage to a gate of that memory cell which is specified by the address signal at a time of data writing, for dropping the first voltage to a second voltage which is lower than the first voltage but higher than the supply voltage, and for supplying the second voltage to the gate of said memory cell at a write verifying time;
   said supply means including:
   first means for supplying said first voltage to said word line which is specified by an address signal at said data writing time and said write verify time, said first means including a P type first MOS transistor having a gate connected to said word lines, and having a current path one end of which is connected to receive said first voltage;
   an N type second MOS transistor having a gate connected to said word lines, and having a current path one end of which is grounded and the other end of which is connected to the other end of said current path of said P type first MOS transistor;
   a P type third MOS transistor having a current path one end of which is connected to said word lines and the other end of which is connected to receive said first voltage, and having a gate connected to a connection between said first MOS transistor and said second MOS transistor; and
   said supply means further including:
   second means for dropping a voltage of said word line specified by the address signal at the write verify time,
   said second means including a P type MOS transistor having a current path one end of which is connected to said word lines and the other end of which is grounded, and having a gate supplied with a predetermined control signal.

4. The flash memory according to claim 1, further comprising a circuit provided between said internal booster circuit and said supply means for short-circuiting said internal booster circuit and said supply means at the data writing time and connecting both via a resistor at the write verify time.

* * * * *